(12) United States Patent
Ben-Porath

(10) Patent No.: US 6,922,482 B1
(45) Date of Patent: Jul. 26, 2005

(54) HYBRID INVARIANT ADAPTIVE AUTOMATIC DEFECT CLASSIFICATION

(75) Inventor: Ariel Ben-Porath, Rehovot (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/334,049

(22) Filed: Jun. 15, 1999

(51) Int. Cl.$^7$ .............................................. G06K 9/00
(52) U.S. Cl. .................... 382/149; 382/146; 382/147
(58) Field of Search ................................ 382/141–152; 348/86, 87, 125, 126; 250/559.08, 309, 310, 311, 559.46, 223 B; 702/35; 378/37; 706/14; 700/110

(56) References Cited

U.S. PATENT DOCUMENTS

| | | | | |
|---|---|---|---|---|
| 5,172,421 A | * | 12/1992 | Nakamura et al. | 250/559.08 |
| 5,768,333 A | * | 6/1998 | Abdel-Mottaleb | 378/37 |
| 6,047,083 A | * | 4/2000 | Mizuno | 348/87 |
| 6,092,059 A | * | 7/2000 | Straforini et al. | 706/14 |
| 6,408,219 B2 | * | 6/2002 | Lamey et al. | 700/110 |

OTHER PUBLICATIONS

Paul B. Chou et al., "Automatic Defect Classification for Semiconductor Manufacturing", *Machine Vision and Applications*, 1997, pp. 201–213.

Rivi Sherman et al., "An Automatic Defect Classification System for Semiconductor Wafers", *Machine Vision Applications in Industrial Inspection*, SPIE vol. 1907, 1993, pp. 72–78.

Louis Breaux et al., "Automatic Defect Classification System for Patterned Semiconductor Wafers", 1995 International Symposium on Semiconductor Manufacturing., pp. 69–73.1.

* cited by examiner

*Primary Examiner*—Vikkram Bali
(74) *Attorney, Agent, or Firm*—McDermott, Will & Emery

(57) ABSTRACT

A method and apparatus is provided for automatically classifying a defect on the surface of a semiconductor wafer into one of a predetermined number of core classes using a core classifier employing boundary and topographical information. The defect is then further classified into a subclass of arbitrarily defined defects defined by the user with a specific adaptive classifier associated with the one core class and trained to classify defects only from a limited number of related core classes. Defects that cannot be classified by the core classifier or the specific adaptive classifiers are classified by a full classifier.

30 Claims, 8 Drawing Sheets

HYBRID INVARIANT ADAPTIVE AUTOMATIC DEFECT CLASSIFICATION

FIELD OF THE INVENTION

The present invention relates to a method and apparatus for automatically classifying defects on the surface of an article. The invention has particular applicability for in-line inspection of semiconductor wafers during manufacture of high density semiconductor devices with submicron design features.

BACKGROUND ART

Current demands for high density and performance associated with ultra large scale integration require submicron features, increased transistor and circuit speeds and improved reliability. Such demands require formation of device features with high precision and uniformity, which in turn necessitates careful process monitoring, including frequent and detailed inspections of the devices while they are still in the form of semiconductor wafers.

Conventional in-process monitoring techniques employ an "inspection and review" procedure wherein the surface of the wafer is initially scanned by a high-speed, relatively low-resolution inspection tool; for example, an opto-electric converter such as a CCD (charge-coupled device) or a laser. Statistical methods are then employed to produce a defect map showing suspected locations on the wafer having a high probability of a defect. If the number and/or density of the potential defects reaches a predetermined level, an alarm is sounded, indicating that a more detailed look at the potential defect sites is warranted. This technique is known as "total density monitoring" of defects and produces a statistic called the "total defect density".

When the defect density reaches a predetermined level, a review of the affected wafers is warranted. After a redetection procedure is carried out, using the defect map, to positively determine the presence of defects, a more detailed review procedure is carried out on the individual defect sites, such as scanning with a CCD to produce a relatively high-resolution image. The defect image is then analyzed to determine the nature of the defect (e.g., a defective pattern, a particle, or a scratch).

Since it has recently been recognized that monitoring "classified defect density", i.e., the number of defects of several different types, or "classes" of defects, is preferable to monitoring total defect density, various methods for classification of defects have been introduced. Most of these conventional methods, called "classic classifiers" herein, employ pattern recognition techniques wherein a set of sample defects is acquired, imaged and analyzed for particular characteristics or "predicates" (e.g., brightness, roughness, size, color), which predicates are fed into a "black box" (e.g., a neural net) and used to train the classifier to recognize different types of defects by the defects' predicates.

Disadvantageously, the efficiency of these methods is reduced because there is no agreed-upon set of defect classes. Different semiconductor fabricators consider different defects to be important and, therefore, use different sets of defect classes tailored to their specific needs. Thus, they require many examples of defect images to be obtained for each defect class prior to becoming operational. Consequently, typical prior art systems cannot be used during start-up and ramp-up of a production line. Furthermore, because such classifiers, also referred to as "full classifiers" herein, need to discriminate between all defect types required to be classified (e.g., 10 or more classes of defects), a large number of predicates must be considered when classifying any defect, thus increasing inspection time and reducing production throughput.

To address the above-mentioned problems associated with full classifiers, an invariant core classifier ("core classifier" herein) has recently been introduced in the defect review system marketed as the SEMVision™, available from Applied Materials of Santa Clara, Calif. Such a core classifier is described in copending U.S. patent application Ser. No. 09/111,454, filed Jul. 8, 1998, entitled "Automatic Defect Classification With Invariant Core Classes", the entire disclosure of which is hereby incorporated by reference.

According to the methodology of the copending application, after a defect map of a semiconductor wafer has been generated, each defect site and a corresponding known non-defective reference site is imaged by a scanning electron microscope (SEM) to gather and store location and topographical data. The image is then analyzed, as by performing boundary analyses and/or topographical measurements, to classify the defect as being in one of a number (e.g., seven) of invariant core classes of defect, and further classified as being in one of an arbitrary number of core sub-classes as desired by the user by adding preprogrammed modules onto the core classifier.

FIG. 1 is a conceptual flow chart of automatic defect classification into core classes performed by the methodology of the copending application. A defect 1 is classified broadly as a pattern defect 2A or a particle defect 2B, and further placed into one of seven exemplary invariant core classes of defects: craters and microscratches on the wafer surface 3A, a missing pattern on the surface 3B, an extra pattern on the surface 3C, a deformed pattern on the surface 3D, a particle on the surface 3E, a particle embedded in the surface 3F, or a particle and a deformed pattern on the surface 3G. Arbitrary core subclasses may include bridging (i.e., short circuiting) between neighboring wiring patterns, a small particle, a large particle, a broken line, a narrow pattern, etc.

The invariant core classification technique of the copending application enables defects to be separately and reliably classified as particle or pattern defects, and as on-surface or below-surface (embedded) defects. It also provides early quantification and notification of these meaningfully classified defects, thereby facilitating investigation of the causes of the defects, and enabling early corrective action to be implemented.

The core classifier of the copending application is a "rule-based" classifier in that it classifies defects by collecting defect information (i.e., imaging the wafer surface and performing boundary analysis and/or topographical measurement of its features) then following a set of rules programmed a priori (i.e., beforehand). Thus, it does not need to be trained, as do classic classifiers, and so does not require examples of defect images for each class prior to being operational. Therefore, unlike prior art defect classification systems, the core classifier of the copending application can be used during the start-up and ramp-up of a production line.

While core classifiers as described in the copending application address many of the shortcomings of conventional classic classifiers, core classifiers may not be suitable for separating defects into every class deemed important by a user since, as rule-based classifiers, they cannot be easily adapted to recognize new classes of defects. Specifically, the user may require refinements within the invariant core classes (since different process lines may be sensitive to different defects from one to another) other than the core subclasses discussed above available as pre-programmed modules to be added to the core classifier. Furthermore, the user may require refinements that cannot be discerned by the core classifier. For example, if the core classifier classifies a defect as a particle on the surface (core class 3F in FIG. 1), and the user wishes to know the shape of the particle in combination with its size, another technique must be used to obtain this size information, which is helpful in pinpointing the source of the particle, since different processes tend to produce different particle shapes and sizes. Additionally, "exotic" defects that do not fall into any of the core classes cannot be classified by a core classifier. For example, if a process is introduced that results in a new type of defect, the existing core classes will be irrelevant in relation to the new defect, and the core classifier will not be able to classify the new defect unless the new defect is added as a core class.

There exists a need to quickly and meaningfully review semiconductor wafers and automatically classify defects using a core classifier, then further classify the defects into subclasses within a core class desired by the user in order to identify processes causing defects, thereby enabling early corrective action to be taken. This need is becoming more critical as the density of surface features, die sizes, and number of layers in devices increase, requiring the number of defects to be drastically reduced to attain an acceptable manufacturing yield.

SUMMARY OF THE INVENTION

An object of the present invention is to provide a method and apparatus for automatic, fast, reliable and complete classification of defects in semiconductor wafers.

According to the present invention, the foregoing and other objects are achieved in part by a method of classifying a defect on the surface of an article, which method comprises imaging the surface, classifying the defect as being in one of a predetermined number of core classes of defects using a core classifier, and classifying the defect as being in one of an arbitrary number of variant subclasses using a specific adaptive classifier associated with the one core class. If the core classifier cannot classify the defect into a core class, a full classifier is used to classify the defect.

A further aspect of the present invention is an apparatus for carrying out the steps of the above method.

A still further aspect of the present invention is a computer-readable medium bearing instructions for automatically classifying a defect on the surface of an article, the instructions, when executed, being arranged to cause one or more processors to perform the steps of the above method.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Core classifiers, such as described in copending U.S. application Ser. No. 09/111,454, enable defects to be quickly and reliably classified as particle or pattern defects, and as on-surface or below-surface (embedded) defects, and are operable during start-up and ramp-up of a production line. However, core classifiers cannot classify certain types of defects within its core classes, and are not easily modified by the user to add defect classes. Conventional classic classifiers, on the other hand, are fully adaptable to classify any type of defect as trained by the user, but require many examples of defect images to be obtained for each defect class prior to becoming operational. Thus, classic classifiers cannot be used during start-up and ramp-up of a production line. Furthermore, classic-style full classifiers are slower than core classifiers, and generally less accurate. The present invention addresses and solves these problems by providing a hybrid defect classification methodology utilizing a core classifier together with limited-range classic-style classifiers for fast and reliable classification of defects into invariant core classes and variant subclasses as needed by the user. Thus, the present methodology enables ready identification of processes causing defects, thereby enabling early corrective action to be taken.

According to certain embodiments of the methodology of the present invention, after a defect map of a semiconductor wafer has been generated, each defect site and a corresponding known non-defective reference site is imaged by a scanning electron microscope (SEM) to gather and store location and topographical data. This data is then analyzed by a core classifier using boundary analysis and topographical techniques to classify the defect as being in one of a number of predetermined core classes of defect (the core class may be one of a number of invariant core classes or a variant class programmed into the core classifier as desired by the user). The defect is then further classified into one of an arbitrary number of variable subclasses (i.e., subclasses that cannot be discerned by the core classifier) using a "specific adaptive classifier" associated with the core class in which the defect has been placed, which employs classic classifier methodology on a limited scale, for efficiency. If the core classifier or specific adaptive classifier cannot classify the defect into a core class, the defect is analyzed by a conventional full classifier.

Figure 1:
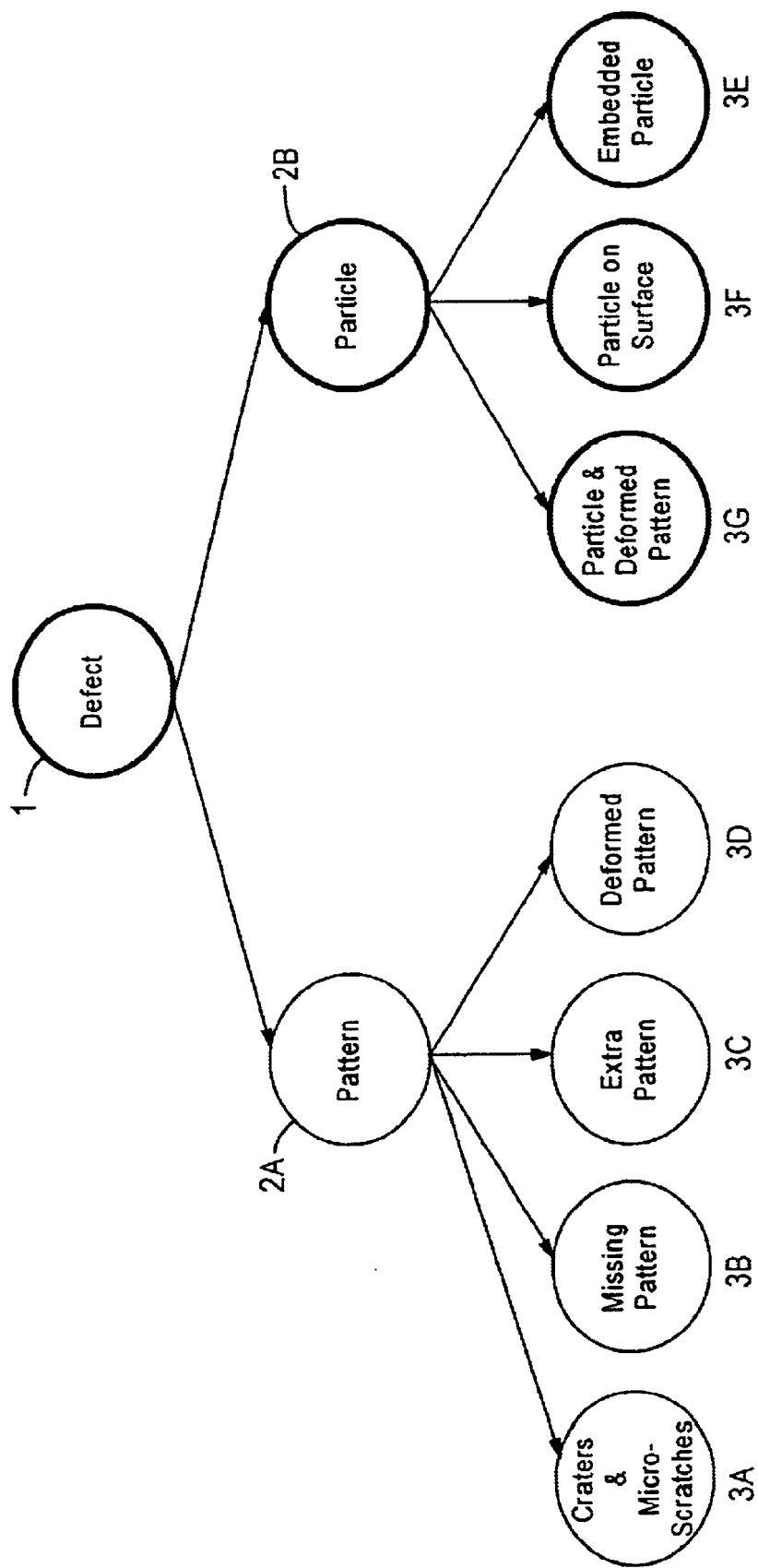
FIG. 1 is a conceptual flow chart of defect classification according to the copending invention.

The specific adaptive classifier of the present methodology operates based on the same principles as a classic classifier, in that it is trained by the user with a set of sample defect images to classify a defect based on the defect's predicates. However, unlike conventional full classifiers that must classify every defect as being in one of many classes (e.g., 10 classes), the specific adaptive classifier analyzes only defects of the core class or classes with which it is associated (e.g., 1, 2 or 3 classes). Thus, the specific adaptive classifier is not trained to consider that the defect may be in one of many classes; rather, the specific adaptive classifier is trained to start its analysis of the defect "knowing" that the defect is in a particular core class. For example, a specific adaptive classifier associated with the "particle on surface" core class 3E in FIG. 1 is able to quickly and accurately determine the attributes of a particle on the surface as required by the user, because it does not need to first determine that the defect is a particle rather than a pattern defect (such as 3B–3D) or a scratch (3A). In other words, the specific adaptive classifier is presented with a "sub-problem" (e.g., a defect that it knows is in one of, say, 2 or 3 classes) that is easier to solve than the total problem (a defect that could be in one of 10 or more classes). This limit on the domain of the specific adaptive classifier enables it to classify defects more reliably and faster than a conventional classic classifier, since the specific adaptive classifier needs to consider less predicates to reach its decision in most situations. That is, because the specific adaptive classifier knows what class the defect is in, it will consider a particular set of predicates first and not consider predicates irrelevant to the core class with which it is associated.

The present invention utilizes the best attributes of three different types of classifiers to perform defect classification more quickly and reliably than prior art methodologies. It employs a core classifier for fast initial classification of defects into a predetermined number of core classes, the core classifier being able to work during start-up and ramp-up of a production line because it does not require examples of defects. It also uses specific adaptive classifiers in parallel with the core classes for local refinement within a core class. The present invention further employs a full classifier, but only on a limited basis for special types of defects that do not fit in to the core classification scheme. Thus, as the fabrication process matures and the types of defects of interest become more diverse, the specific adaptive and full classifiers can be trained as needed to perform more detailed defect classification.

Figure 2:
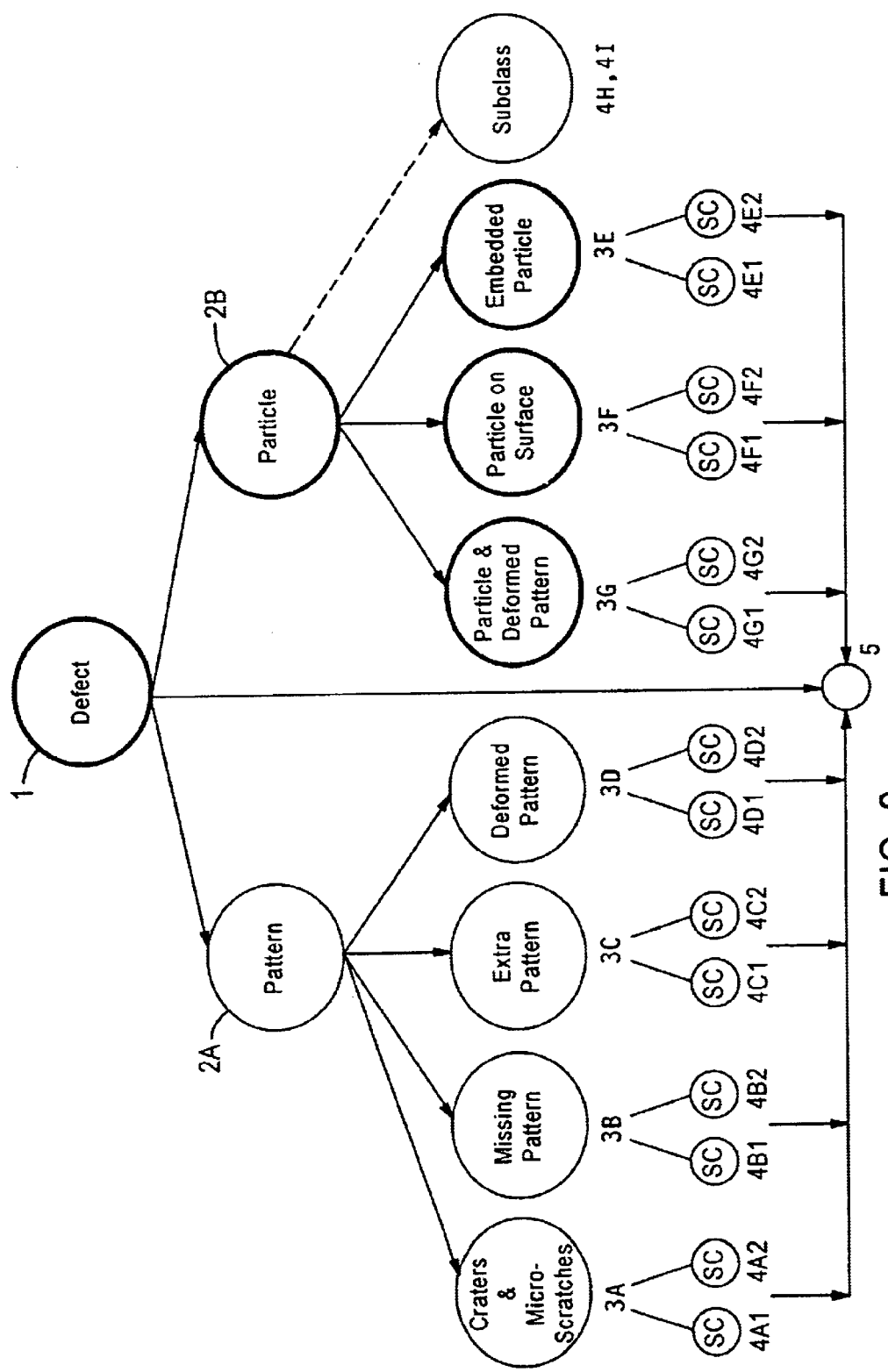
FIG. 2 is a conceptual flow chart of defect classification according to the present invention.

FIG. 2 is a conceptual flow chart of automatic defect classification performed by the methodology of the present invention. A defect 1 is classified broadly by a core classifier, as discussed above, as a pattern defect 2A or a particle defect 2B, and further placed into one of seven exemplary invariant core classes of defects 3A–3G. The core classifier can further place the defects in core subclasses (not shown) including bridging (i.e., short circuiting) between neighboring wiring patterns, a small particle, a large particle, a broken line, a narrow pattern, etc. as desired by the user by adding pre-programmed "modules" onto the core classifier. Defects in each of the core classes 3A–3G are then classified into an arbitrary number of variable subclasses SC 4A1–4G2 as desired by the user by specific adaptive classifiers trained by the user. Alternatively, defects can be classified by a specific adaptive classifier into a subclass such as 4H directly after being broadly classified as a particle or pattern defect, as shown by the dashed line in FIG. 2. The decision as to how far the core classifier classifies a defect before the specific adaptive classifiers are used is based on the experience of the user in an effort to obtain the best classification results. Defects that cannot be classified by the core classifier or the specific adaptive classifiers are sent to a full classifier trained by the user that classifies them into an appropriate class 5.

Figure 3:
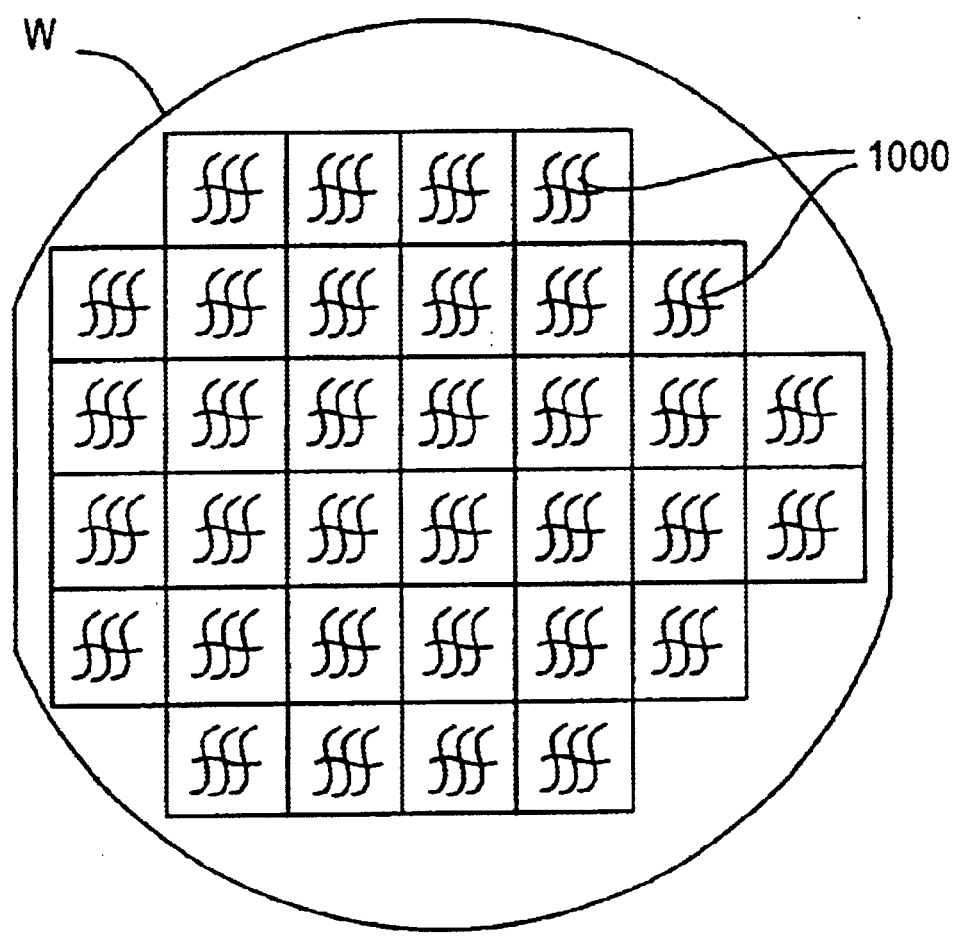
FIG. 3 illustrates a semiconductor wafer to be inspected using the present invention.

An embodiment of the present invention is illustrated in FIGS. 3–6. As shown in FIG. 3, a semiconductor wafer W to be inspected for defects has a plurality of patterned integrated circuit dies 1000. Initially, a defect map is produced by conventional techniques, such as by scanning the surface of a wafer with a high-speed inspection tool (a CCD, a laser or an SEM may be employed for this purpose), then using statistical methods, typically involving algorithms and/or grey-scale analysis, to identify suspected locations on the wafer having a high probability of having a defect.

Figure 4A:
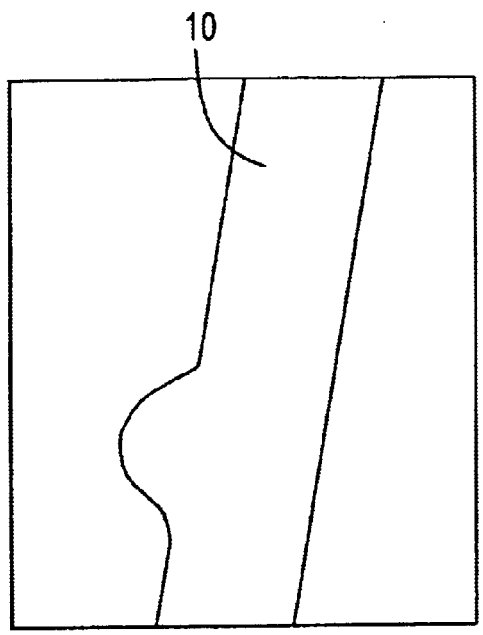
FIGS. 4A–4C are representations of images of a defect to be inspected by the present invention.
Figure 4B:
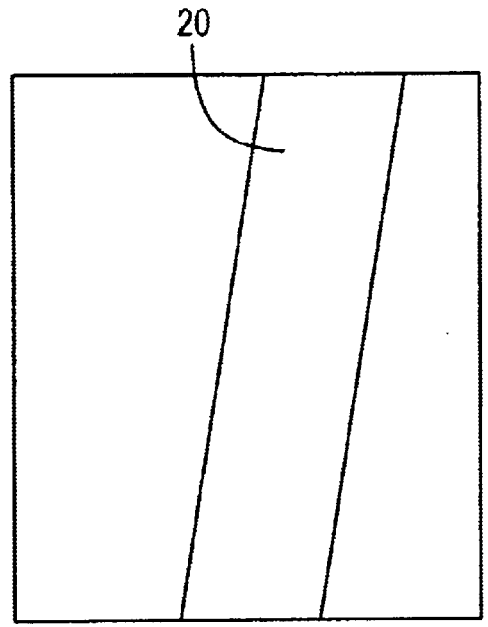
Figure 4C:
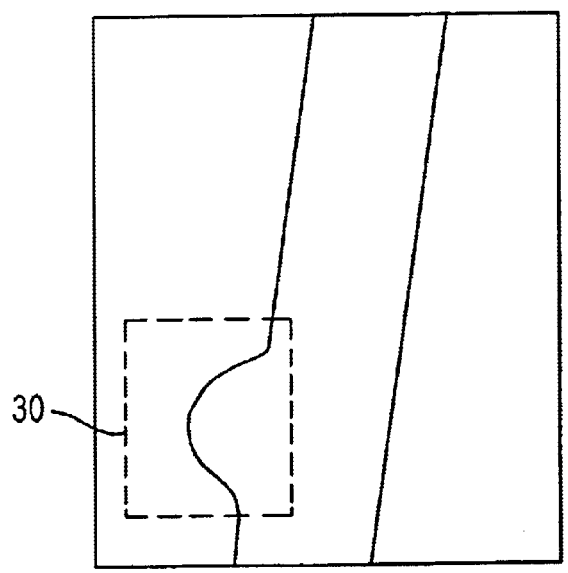

Next, as shown in FIGS. 4A–4C, a redetection procedure is carried out at each suspected defect location to determine the exact location of the defect. A conventional CCD scanner or an SEM may be used to image a pattern 10 at a suspected defect location, which is then compared to a reference pattern 20 at a corresponding location on an adjacent or other die on the same wafer which is not suspected of having a defect. If a difference 30 is found between the suspected defective pattern 10 and the reference pattern 20, the suspected defective pattern 10 is determined to be a defect, and the inventive analysis and classification commences.

Figure 5:
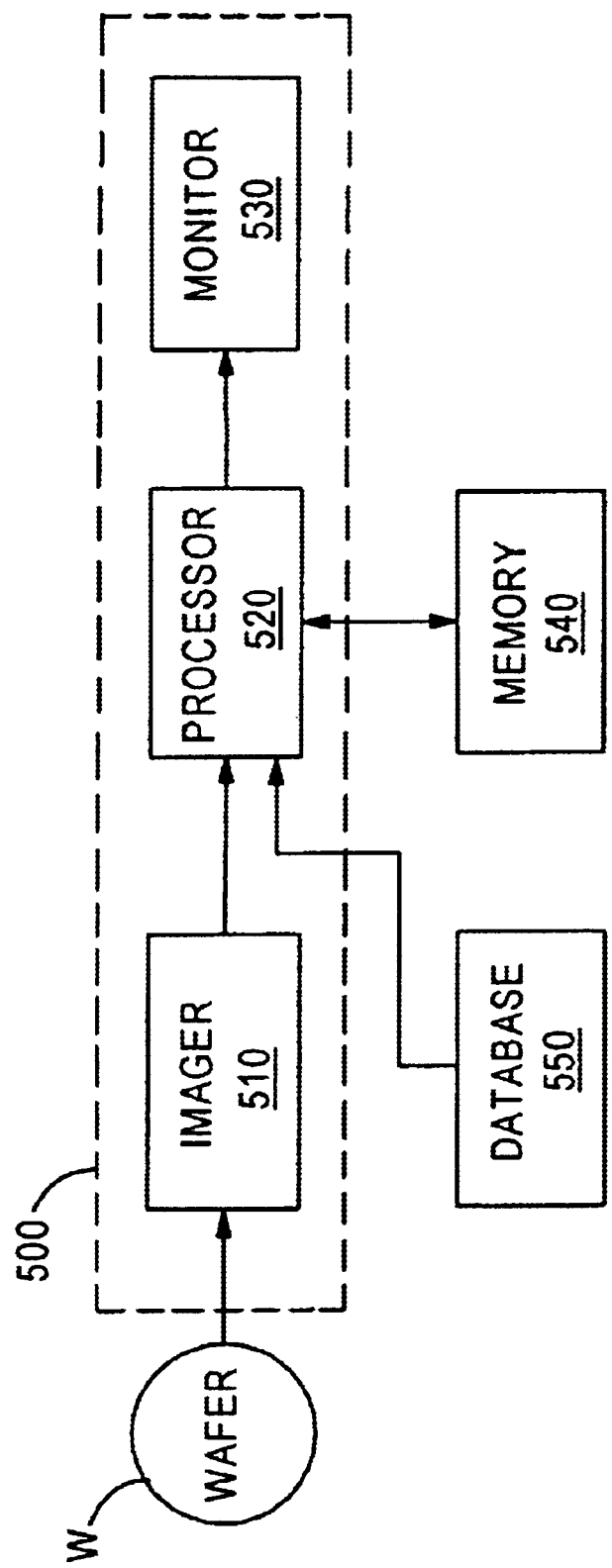
FIG. 5 is a block diagram of a review tool according to the present invention.

The present invention is implemented at a review tool 500, as shown in FIG. 5, comprising an imager 510, preferably a high resolution SEM such as the SEMVision™ available from Applied Materials, Santa Clara, Calif., or as described in the copending application. Review tool 500 further comprises a processor 520, which preferably performs the analysis disclosed herein electronically, and a monitor 530 for displaying results of the analyses of processor 520. Processor 520 can be in communication with a conventional wafer reference design database 550 and a memory device 540, such as a semiconductor memory.

Figure 6:
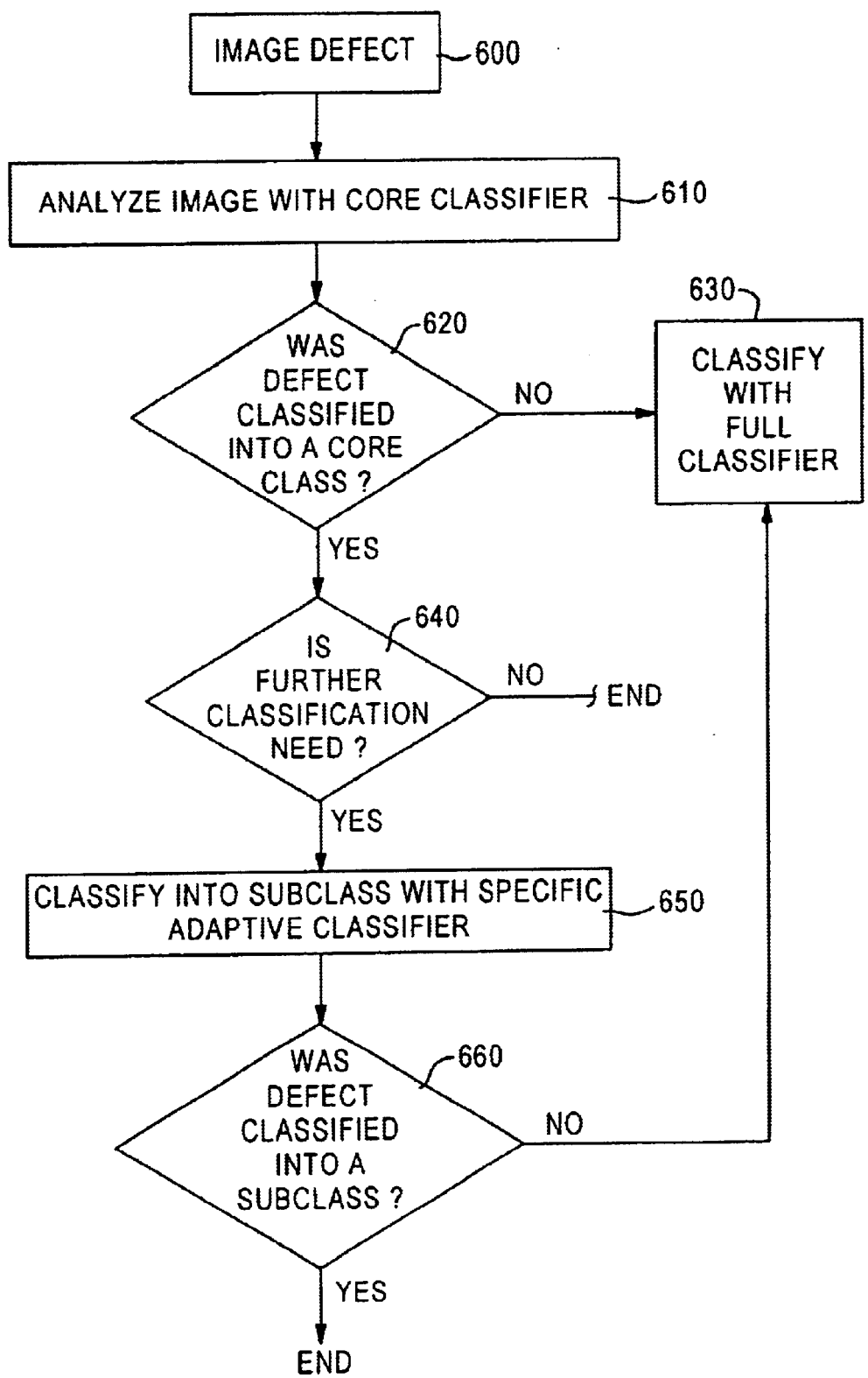
FIG. 6 is a flow chart illustrating sequential steps of a method according to the present invention.
Figure 7:
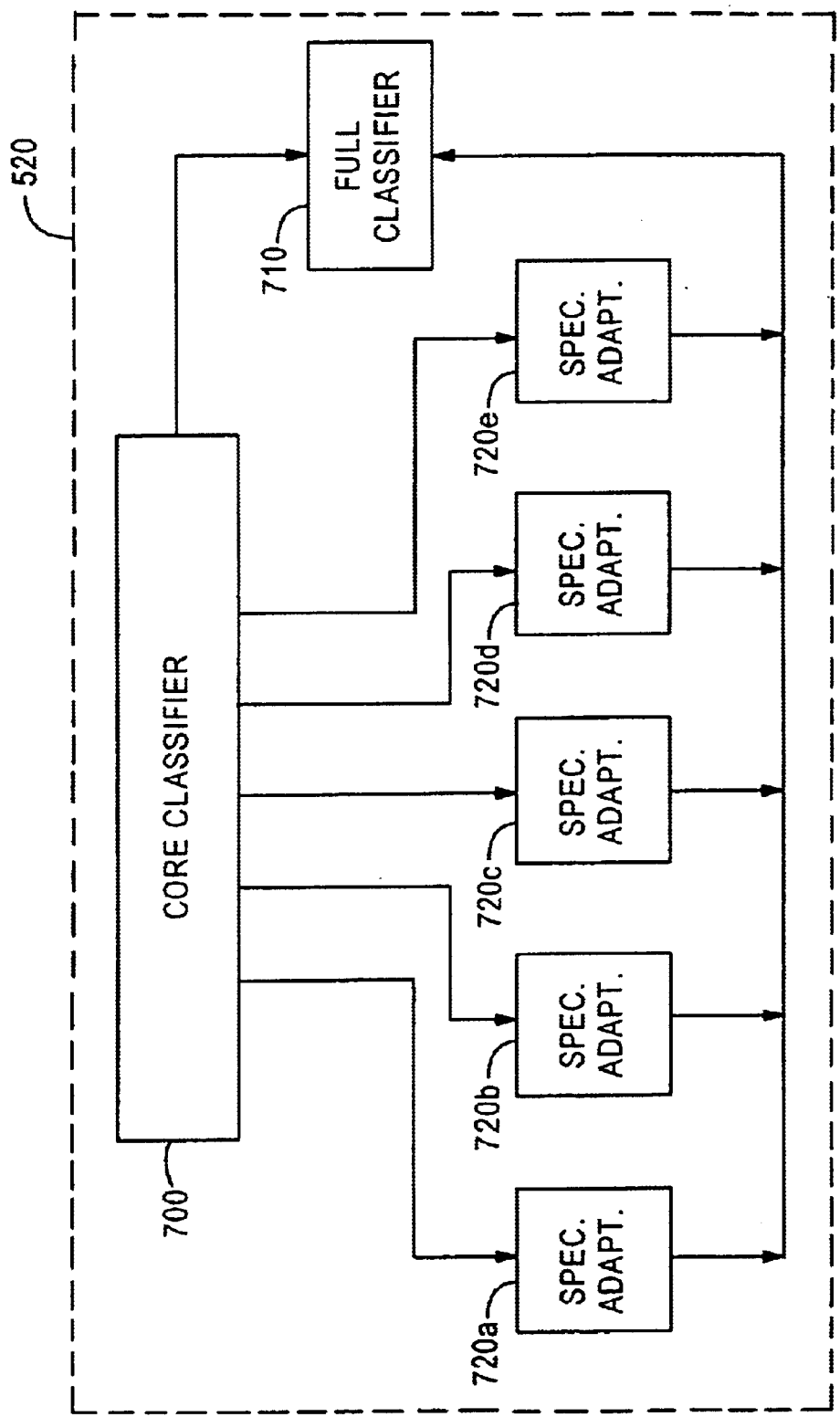
FIG. 7 is a function block diagram of an inspection tool according to the present invention.

FIG. 6 is a flow chart of an embodiment of the inventive methodology, and FIG. 7 is a functional block diagram of processor 520. At step 600, the defect is imaged by imager 510 as discussed above. Next, the defect image is analyzed in step 610 by a core classifier 700 as disclosed in the copending application, by performing a boundary analysis of the image and/or a topographical analysis of the image. If it is determined at step 620 that core classifier 700 cannot classify the defect into a predetermined core class (e.g., classes 2A–B or 3A–3G in FIG. 2), the defect image is analyzed by full classifier 710 at step 630.

If core classifier 700 classifies the defect, it is determined at step 640 whether further classification into a subclass of a core class is required. If not, the classification procedure ends. If further classification into a subclass is needed, the defect image is further analyzed by one of specific adaptive classifiers 720a–720e associated with the core class 2A, 2B or 3A–3G into which the defect was classified by core classifier 700 (see step 650). For example, if core classifier 700 classifies the defect as a particle on the surface (i.e., core class 3F) or a particle embedded in the surface (core class 3E) and the user wishes to know the shape in combination with the size of the particle, one of the specific adaptive classifiers 720a–e, that has been trained by the user to determine particle shape/size if it is given a known particle defect, then further analyzes the defect image. If the appropriate specific adaptive classifier 720a–720e successfully classifies the defect as desired, the classification procedure ends at step 660. If not, the defect is further analyzed by full classifier 710 at step 630.

To achieve the advantages of reduced inspection time and increased classification reliability of the present methodology, specific adaptive classifiers 720a–e are each associated with (i.e., analyze known defects from) a limited number of core classes 2A, 2B, 3A–3G, e.g., two or three core classes. Each specific adaptive classifier 720a–e is trained to identify defects of a subclass by providing the specific adaptive classifier a set of predicates (i.e., feature descriptors) of a number of examples of known defects of the subclass. In operation, the specific adaptive classifier analyzes the same predicates of a defect to be classified to determine if the defect falls in the subclass.

Because specific adaptive classifiers 720a–e only classify defects of a small number of core classes, each can be trained to expect only defects from those classes; in other words, each specific adaptive classifier can be trained to begin its analysis by looking at a particular set of predicates of the defect image. This list of predicates is generally much shorter than the list of predicates a conventional full classifier must consider as it begins its analysis of an unclassified defect. Specific adaptive classifiers typically consider only about 4–7 predicates, while conventional full classifiers typically utilize 40–100 predicates. For example, a specific adaptive classifier used to further classify a defect determined by core classifier 700 to be a particle defect would have been trained to first consider predicates such as size, brightness, roughness and roundness of the particle. In contrast, a specific adaptive classifier for further classifying a defect determined by core classifier 700 to be a pattern defect would typically be trained to first consider predicates such as pattern size, distance from other patterns, area of the pattern, etc.; but not brightness, roundness and roughness, since these predicates are not necessarily relevant to pattern defects. Additionally, a specific adaptive classifier for further classifying defects determined to be scratches by core classifier 700 would typically be trained to consider yet another different set of predicates, such as scatter, elongation and non-circularity. Thus, by being trained to look for a relatively narrow range of defects, specific adaptive classifiers 720a–e enable further classification of defects after core classification with a minimum of inspection time.

Specific adaptive classifiers 720a–e are typically configured to be trained using well-known classic classifier techniques, such as a "decision tree" technique or a "multidimensional clustering" technique. The decision tree technique typically comprises the classifier analyzing a first predicate of the defect image, then using the value of the first predicate to determine the next predicate to be analyzed, and so on until the defect is classified. In the multidimensional clustering technique, the classifier is trained to consider a number of predicates "x" of the known sample defects, each sample defect being treated as a point having x coordinates hanging in x-dimensional space. The classifier executes algorithms to plot the points and determine whether they are clustered together. If so, the classifier connects the points (e.g., with an ellipsoid) and deems that every point inside the ellipsoid represents the same kind of defect as the sample defects. Of course, any technique used to construct a classic classifier can be used to construct a specific adaptive classifier.

Moreover, a specific adaptive classifier can be given a set of rules to follow to classify defects, rather than being trained, or can operate using a combination of rule-based and learned (i.e., trained) classification techniques. For example, if the core classifier classifies a defect as a particle, and the specific adaptive classifier is to determine the size of the particle, the specific adaptive classifier can be programmed to "measure" the particle's diameter using information gathered by the core classifier and then follow an algorithm to classify the particle as a "large particle" (e.g., above x$\mu$m diameter), "small particle" (e.g., below x$\mu$m diameter), etc. as determined by the user. Alternatively, the specific adaptive classifier can be trained to analyze particle size by giving the specific adaptive classifier a number of examples of particle defects, using a multidimensional clustering technique to plot the particles according to their size, and attempting to cluster them into a number of size categories (e.g., two, three, or four separate categories) such as "small", "medium", "large", etc. as determined to be significant by the classifier. If the specific adaptive classifier cannot cluster the defects; e.g., if they are found to be evenly or randomly distributed rather than clustered, then the user will need to design a set of rules for classing the particles by size, as by using an algorithm as discussed above.

Figure 8:
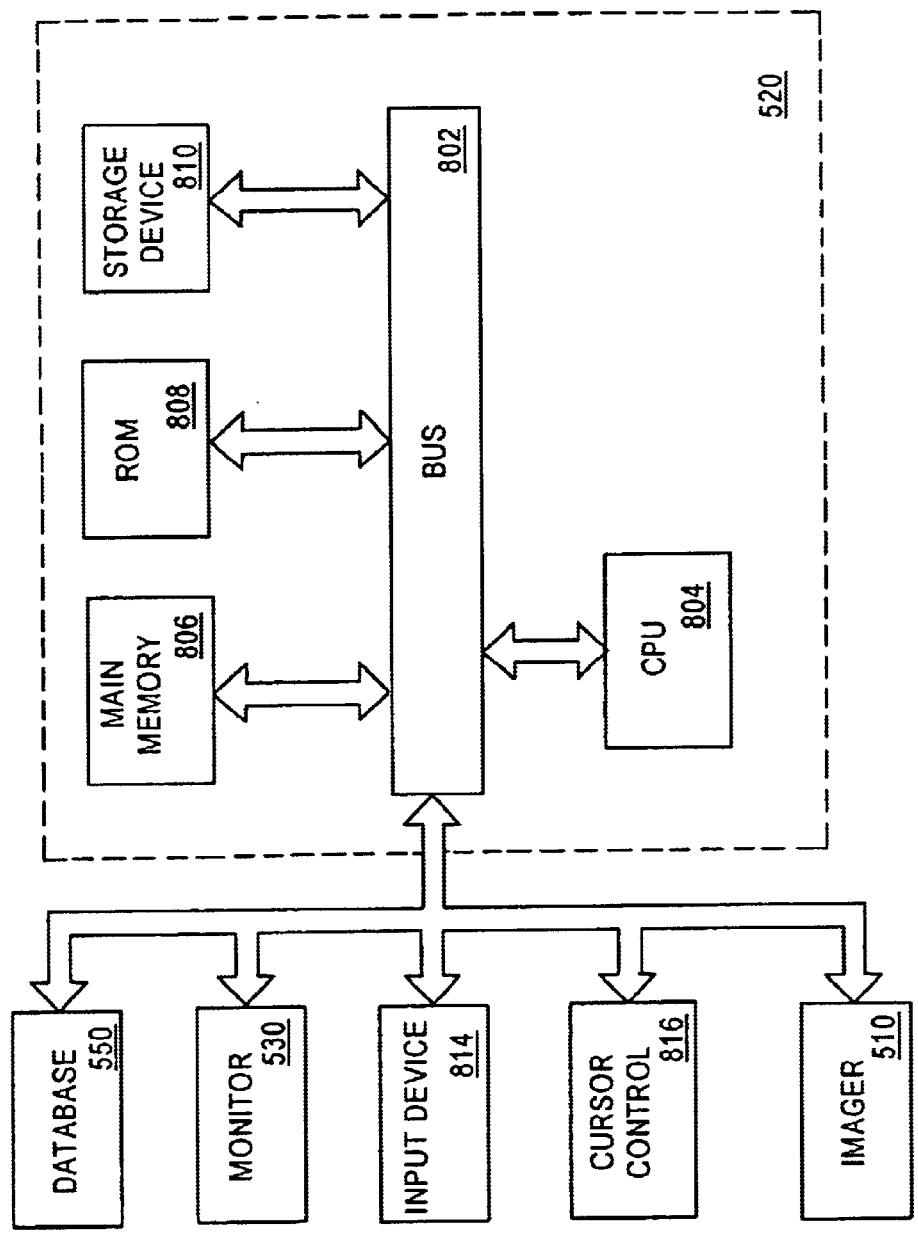
FIG. 8 is a block diagram that illustrates an embodiment of the invention.

FIG. 8 is a block diagram that illustrates an embodiment of the invention shown in FIG. 5. According to this embodiment, processor 520, as shown in FIG. 5, includes a bus 802 or other communication mechanism for communicating information, and a central processing unit (CPU) 804 coupled with bus 802 for processing information. Processor 520 also includes a main memory 806, such as a random access memory (RAM) or other dynamic storage device, coupled to bus 802 for storing information and instructions to be executed by CPU 804. Main memory 806 also may be used for storing temporary variables or other intermediate information during execution of instructions to be executed by CPU 804. Processor 520 further includes a read only memory (ROM) 808 or other static storage device coupled to bus 802 for storing static information and instructions for CPU 804. A storage device 810, such as a magnetic disk or optical disk, is provided and coupled to bus 802 for storing information and instructions. Storage device 810 may also serve as memory 540 in FIG. 5.

Processor 520 may be coupled via bus 802 to monitor 530, such as a cathode ray tube (CRT), for displaying information to a computer user. An input device 814, including alphanumeric and other keys, is coupled to bus 802 for communicating information and command selections to CPU 804. Another type of user input device is cursor control 816, such as a mouse, a trackball, or cursor direction keys for communicating direction information and command selections to CPU 804 and for controlling cursor movement on monitor 330.

Imager 510 (FIG. 3) inputs data representative of images of a semiconductor wafer under inspection, as discussed above, to bus 802. Such data may be stored in main memory 806 and/or storage device 540, and used by CPU 804 as it executes instructions. Imager 510 may also receive instructions via bus 802 from CPU 804.

Likewise, database 550 (FIG. 3) inputs data representative of a substantially defectless wafer, as discussed above, to bus 802. Such data may be stored in main memory 806 and/or storage device 540, and used by CPU 804 as it executes instructions.

The invention is related to the use of processor 520 for inspecting the surface of a semiconductor wafer for defects. According to one embodiment of the invention, inspection of the surface of a semiconductor wafer, including classification of surface defects, is provided by processor 520 in response to CPU 804 executing one or more sequences of one or more instructions contained in main memory 806. Such instructions may be read into main memory 806 from another computer-readable medium, such as storage device 810. Execution of the sequences of instructions contained in main memory 806 causes processor 804 to perform the process steps described above. One or more processors in a multi-processing arrangement may also be employed to execute the sequences of instructions contained in main memory 806. In alternative embodiments, hard-wired circuitry may be used in place of or in combination with software instructions to implement the invention. Thus, embodiments of the invention are not limited to any specific combination of hardware circuitry and software. The programming of the apparatus is readily accomplished by one of ordinary skill in the art provided with the flow chart of FIG. 6.

The term "computer-readable medium" as used herein refers to any medium that participates in providing instructions to CPU 804 for execution. Such a medium may take many forms, including but not limited to, non-volatile media, volatile media, and transmission media. Non-volatile media include, for example, optical or magnetic disks, such as storage device 810. Volatile media include dynamic memory, such as main memory 806. Transmission media include coaxial cable, copper wire and fiber optics, including the wires that comprise bus 802. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer-readable media may be involved in carrying out one or more sequences of one or more instructions to CPU 804 for execution. For example, the instructions may initially be borne on a magnetic disk of a remote computer. The remote computer can load the instructions into its dynamic memory and send the instructions over a telephone line using a modem. A modem local to processor 520 can receive the data on the telephone line and use an infrared transmitter to convert the data to an infrared signal. An infrared detector coupled to bus 802 can receive the data carried in the infrared signal and place the data on bus 802. Bus 802 carries the data to main memory 806, from which CPU 804 retrieves and executes the instructions. The instructions received by main memory 806 may optionally be stored on storage device 810 either before or after execution by CPU 804.

The inventive semiconductor wafer inspection technique enables defects to be quickly and reliably classified into core classes such as particle or pattern defects, and further into subclasses of the core classes. Since the inventive methodology classifies defects into core classes by imaging the wafer surface and performing boundary analysis and/or topographical measurement of its features, it does not require examples of defect images for each class prior to being operational. Therefore, unlike prior art defect classification systems using classic classifiers alone, the present invention can be used during the start-up and ramp-up of a production line. Furthermore, the present invention utilizes specific adaptive classifiers, tailored to expect defects from only a small number of core classes, to classify defects into variable subclasses as desired by the user, employing classic classifier techniques with reduced inspection time and increased accuracy. Thus, the present invention provides classification of defects upon start-up and ramp-up of a production line by using a core classifier, along with the flexibility of classic-style adaptive classifiers to allow the classification of varied subclasses of defects as the production line matures.

The present invention is applicable to the inspection of any semiconductor wafer, and is especially useful for in-process inspection of semiconductor wafers during manufacture of high-density semiconductor devices with submicron design features.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of classifying a defect on the surface of an article, which method comprises:

imaging the surface to form a defect image;

classifying the defect as being in one of a predetermined number of core classes of defects using a rule-based core classifier; and classifying the defect as being in one of an arbitrary number of variant subclasses using a specific adaptive classifier associated with the one core class and associated with less than the predetermined number of core classes, the specific adaptive classifier being a classic classifier trained by the user with a set of sample defect images.

2. The method according to claim 1, comprising classifying the defect as being in one of an arbitrary number of variant classes using a full classifier when the core classifier cannot classify the defect into one of the core classes.

3. The method according to claim 1, wherein the core classes of defects comprise a pattern defect and a particle defect.

4. The method according to claim 3, wherein the core classes of defects comprise a missing pattern on the surface, an extra pattern on the surface, a particle on the surface, a particle embedded in the surface, and microscratches on the surface.

5. The method according to claim 4, wherein the variant subclasses of defects comprise a particle of a predetermined size on the surface or embedded in the surface.

6. The method according to claim 1, comprising providing a plurality of specific adaptive classifiers, each being associated with less than the predetermined number of core classes.

7. The method according to claim 1, comprising performing a boundary analysis of the defect image, a topographical analysis of the defect image, or both to classify the defect into the one core class.

8. The method according to claim 7, comprising:

training the specific adaptive classifier to identify defects of the variant subclass based on an exemplary set of known predicates of defects of the variant subclass; and analyzing predicates associated with the defect image, using the specific adaptive classifier, to classify the defect into one of the variant subclasses.

9. The method according to claim 8, comprising training the specific adaptive classifier using decision tree or multidimensional clustering techniques.

10. An apparatus for classifying a defect on the surface of an article, comprising:
an imager to produce an image of the defect; and
a processor comprising:
a rule-based core classifier for classifying the defect as being in one of a predetermined number of core classes of defects, and
a specific adaptive classifier associated with the one core class and associated with less than the predetermined number of core classes for classifying the defect as being in one of an arbitrary number of variant subclasses, the specific adaptive classifier being a classic classifier trained by the user with a set of sample defect images.

11. The apparatus according to claim 10, wherein the processor further comprises a full classifier for classifying the defect as being in one of an arbitrary number of variant classes when the core classifier cannot classify the defect into one of the core classes.

12. The apparatus according to claim 10, wherein the core classes of defects comprise a pattern defect or a particle defect.

13. The apparatus according to claim 12, wherein the core classes of defects comprise a missing pattern on the surface, an extra pattern on the surface, a particle on the surface, a particle embedded in the surface, and microscratches on the surface.

14. The apparatus according to claim 13, wherein the variant subclasses of defects comprise a particle of a predetermined size on the surface or embedded in the surface.

15. The apparatus according to claim 10, comprising a plurality of specific adaptive classifiers, each being associated with less than the predetermined number of core classes.

16. The apparatus according to claim 10, wherein the processor is further configured to perform a boundary analysis of the defect image, a topographical analysis of the defect image, or both to classify the defect into the one core class.

17. The apparatus according to claim 16,
wherein the specific adaptive classifier is trainable to identify defects of the variant subclass based on an exemplary set of known predicates of defects of the variant subclass; and
wherein the specific adaptive classifier is for analyzing predicates associated with the defect image to classify the defect into one of the variant subclasses.

18. The method according to claim 17, wherein the specific adaptive classifier is trainable using decision tree or multidimensional clustering techniques.

19. A classic-style specific adaptive classifier, trained by the user with a set of sample defect images, for classifying a defect on the surface of an article as being in one of an arbitrary number of variant subclasses of a core defect class of a predetermined number of core classes, the specific adaptive classifier being associated with less than the predetermined number of core classes and responsive to a rule-based core classifier for classifying the defect as being in the core class.

20. The specific adaptive classifier of claim 19, wherein the specific adaptive classifier is trainable to identify defects of the variant subclass based on an exemplary set of known predicates of defects of the variant subclass; and
wherein the specific adaptive classifier is for analyzing predicates associated with an image of the defect to classify the defect into one of the variant subclasses.

21. The specific adaptive classifier of claim 20, wherein the specific adaptive classifier is trainable using decision tree or multidimensional clustering techniques.

22. A computer-readable medium bearing instructions for automatically classifying a defect on the surface of an article, said instructions, when executed, being arranged to cause one or more processors to perform the steps of:
imaging the surface to form a defect image;
classifying the defect as being in one of a predetermined number of core classes of defects based on a set of rules; and
classifying the defect as being in one of an arbitrary number of variant subclasses based on the classification of the defect as being in the one core class and being in less than the predetermined number of core classes, and based on training by the user with a set of sample defect images.

23. The computer-readable medium according to claim 22, wherein the instructions, when executed, are arranged to cause the one or more processors to perform the step of classifying the defect as being in one of an arbitrary number of variant classes when the one or more processors cannot classify the defect into one of the core classes.

24. The computer-readable medium according to claim 22, wherein the core classes of defects comprise a pattern defect and a particle defect.

25. The computer-readable medium according to claim 24, wherein the core classes of defects comprise a missing pattern on the surface, an extra pattern on the surface, a particle on the surface, a particle embedded in the surface, and microscratches on the surface.

26. The computer-readable medium according to claim 25, wherein the variant subclasses of defects comprise a particle of a predetermined size on the surface or embedded in the surface.

27. The computer-readable medium according to claim 22, wherein the instructions, when executed, are arranged to cause the one or more processors to perform a boundary analysis of the defect image, a topographical analysis of the defect image, or both to classify the defect into the one core class.

28. The computer-readable medium according to claim 26, wherein the instructions, when executed, are arranged to cause the one or more processors to perform the steps of:
learning to identify defects of the variant subclass based on an exemplary set of known predicates of defects of the variant subclass; and
analyzing predicates associated with the defect image to classify the defect into one of the variant subclasses.

29. The computer-readable medium according to claim 28, wherein the instructions, when executed, are arranged to cause the one or more processors to perform the learning step using decision tree or multidimensional clustering techniques.

30. The computer-readable medium according to claim 22, wherein the instructions, when executed, are arranged to cause the one or more processors to perform the step of imaging the surface with a scanning electron microscope.

* * * * *